April 11, 1967 R. K. LONG ET AL 3,313,012

METHOD FOR MAKING A PNPN DEVICE BY DIFFUSING

Filed Nov. 13, 1963

Russell K. Long
Jack P. Mize
Roland T. Windecker
INVENTORS

By

United States Patent Office 3,313,012

Patented Apr. 11, 1967

3,313,012
METHOD FOR MAKING A PNPN DEVICE BY DIFFUSING

Russell K. Long, Jack P. Mize, and Roland T. Windecker, Richardson, Tex., assignors to Texas Instruments Incorporated, Dallas, Tex., a corporation of Delaware Filed Nov. 13, 1963, Ser. No. 323,340
5 Claims. (Cl. 29—25.3)

Figure 1A:
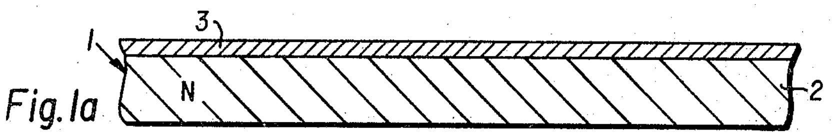

This invention relates to semiconductor devices and more particularly to a process for fabricating an all-planar diffused PNPN switching device.

PNPN devices are four-layer semiconductor devices having alternate P and N layers. These devices in the past have been constructed generally by using combinations of alloy and diffused junctions. Three of the layers have an external connection, the fourth layer is floating. Four-layer, three-terminal devices are made, but none have been made in all-planar diffused configurations.

It is then an object of the present invention to provide a method of producing an all-planar diffused PNPN semiconductor device.

Another object of the invention is to provide a process to improve the stability of PNPN devices.

Still another object is to provide a device having three oxide-stabilized junctions in a planar configuration.

Other objects and features of the invention will become apparent from the following detailed description, taken in conjunction with the appended claims and the attached drawing in which:

FIGURES 1*a* through 1*h* are sectional views of a semiconductor wafer containing two devices illustrating the various steps in the process.

The process described herein provides a method of constructing planar three-junction semiconductor devices. For economy in manufacture more than one device is made on each wafer using photo-masking techniques. Photo-masking is used to accomplish the different diffusion steps which form the several impurity regions making up the device.

Referring to the drawing, there is shown a series of figures, 1*a* through 1*h*, illustrating the various stages of development in the manufacturing of the devices. Two devices are shown on the wafer to illustrate the position of one device in relation to another when multiple devices are made by photo-masking techniques.

Figure 1B:
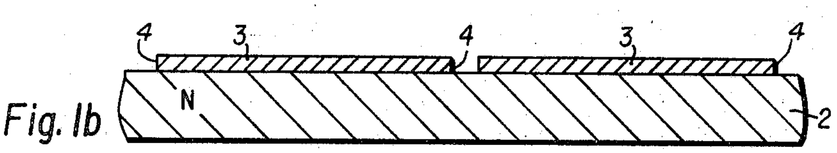

Shown in FIGURE 1*a* is a 6–8 ohm-cm. silicon slice 1 about 6 mils thick with an oxide layer 3 on at least one side thereof. The main body of the slice 2 has been doped with an N-type impurity. The oxide may be grown by any suitable method, for example, exposing the slice to a steam atmosphere in a heated furnace. Next openings 4 are cut through the oxide 3 to expose the surface of N-type region 2. These openings are made by coating the oxide with a photoresist polymer, for example, Eastman Kodak KMER, and processing the photoresist material, a method well-known in the semiconductor industry. The openings 4 are shown in FIGURE 1*b*.

Figure 1C:
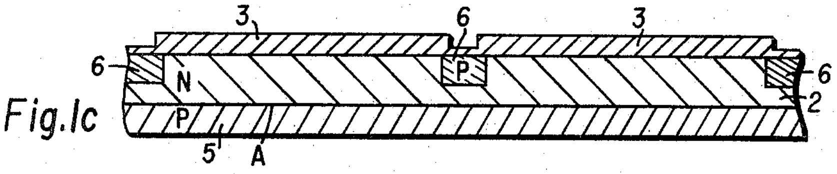

After the openings are made, a P-type impurity, for example boron, is diffused through the openings 4 into the N-type region 2. A diffusion is also made into the opposite side of the slice, as shown in FIGURE 1*c*. The diffusions made through the holes are designated regions 6 and the diffusion in the opposite face is designated 5 and constitutes the P-emitter of the device. After the diffusion, an oxide layer is grown to cover the region 6, FIGURE 1*c*.

Figure 1D:
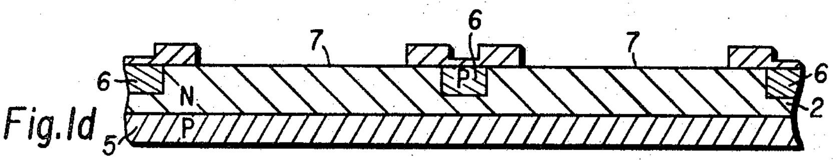
Figure 1E:
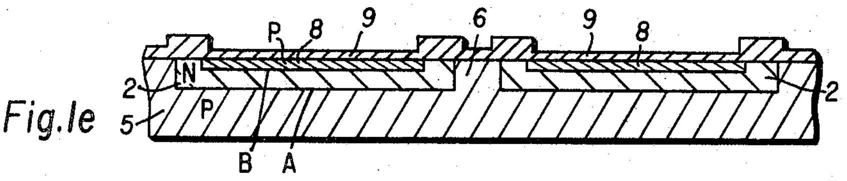
Figure 1F:
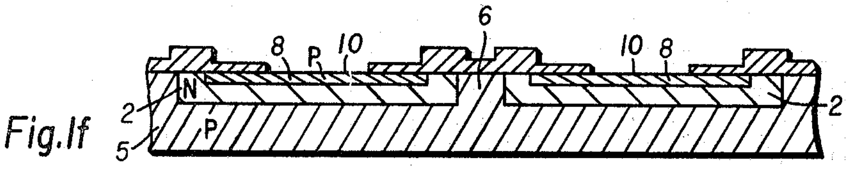

Following the oxide growth covering regions 6, a second openings are made which are generally indicated at 7, FIGURE 1*d*. This opening is made by the same photoresist etch technique as used before. Into these opening a P-type impurity, for example, boron, is diffused. The regions 8, FIGURE 1*e*, are formed by this diffusion. An oxide layer 9 is grown. This layer 9 covers the diffused P-regions 8, as shown in FIGURE 1*e*. At this time it should be noted that the P-regions 6 and the P-region 5 have merged forming a strip of P-type material extending from one surface of the wafer to the to the other. This is shown in FIGURE 1*e*.

Figure 1G:
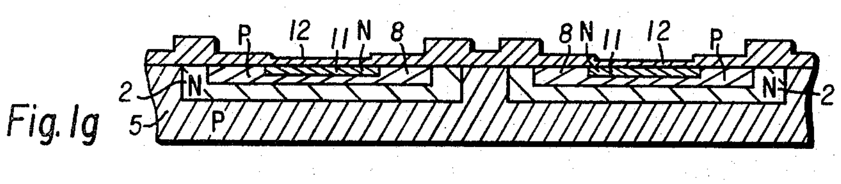

For the final diffusion step, an openings 10 are made in the oxide layer 9 by photo-masking and etching techniques. This last diffusion is made with an N-type impurity material, for example, phosphorus, to form the N-emitter regions 11. Region 11 is covered by an oxide 12, as shown in FIGURE 1*g*.

Figure 1H:
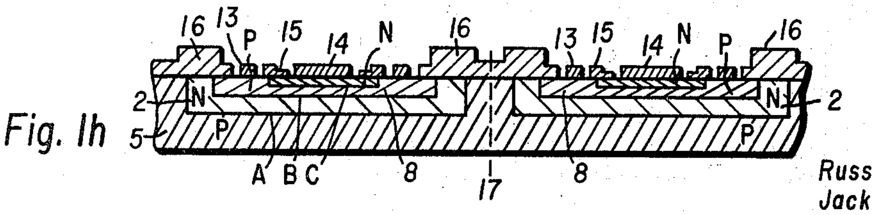

To provide electrical connections with the diffused areas, contacts must be made to them. Openings are made in the oxide layer and contacts 13 and 14 are made by evaporating a suitable material, for example, aluminum. Locations of the contacts 13 and 14 are shown in FIGURE 1*h*. It should be noted that an oxide layer 15 remains over the junctions C separating the N-regions 11 and P-regions 8, and oxide layer 16 covers junctions A and B. These layers remain to protect the junctions and to prevent impurities from bridging and shorting out the junctions. The oxide layers 16 are a build up of all the successive oxide growths made during the process, whereas layers 15 are made up of the two layers 9 and 12. These oxide layers, as indicated above, protect the junctions and tend to stabilize the devices.

Since there is more than one device on each strip of semiconductor material, they must be separated. The slice is broken into individual devices by any suitable method, for example, scribing. Dashed line 17, FIGURE 1*h*, indicates the line of separation for the two devices illustrated in the figures of the drawing.

After the contacts are evaporated and alloyed to the semiconductor body, all that remains is the attaching of the device to the header (not shown), cleaning, and encapsulating.

The above method, including specific impurity diffusants, is given by way of example only and should not be construed a a limitation on the invention. It is apparent then that, although the invention has been described with reference to a specific embodiment, modifications and substitutions may be made that will fall within the scope of the invention, as defined by the appended claims.

What is claimed is:

1. A method of making an all-planar diffused PNPN device comprising the steps of oxidizing an N-type silicon slice, removing the oxide in selected areas, diffusing a P-type impurity into one face of said silicon slice and into first selected areas on the face opposite said one face so that said P-type impurity diffused in said one face and said first selected areas will extend through said N-type silicon slice to form continuous P-type regions through said slice, growing an oxide to cover said first selected diffused areas, removing said oxide in a second selected area on the face opposite said one face, diffusing a P-type impurity into the opening in the oxide to form a second P-type region distinct from said first selected diffused areas, growing an oxide over said P-type region, removing said oxide in a third selected area on the face opposite said one face, diffusing an N-type impurity to form an N-type region in said second P-type region, growing an oxide over said N-type region, removing the oxide exposing a portion of said second P-type region and said N-type region and evaporating contact material to alloy with said exposed region.

2. The method according to claim 1, wherein the N-type silicon slice has a resistivity in the range of 6–8 ohm-cm.

3. The method according to claim 1, wherein the P-type diffusant is boron.

4. The method according to claim 1, wherein the N-type diffusant is phosphorus.

5. A method of making an all-planar diffused PNPN device comprising the steps of oxidizing an N-type, 6–8 ohm-cm. silicon slice 6 mils thick, removing the oxide from one face of the slice and from first selected areas from the face opposite said one face, diffusing boron into said one face and said first selected areas so that the boron diffused in said one face and said second selected areas will extend through said N-type silicon slice to form continuous P-type regions through said slice, coating said diffused areas with oxide, removing a portion of the oxide on the face of the slice opposite said one face and diffusing boron into a second selected area therein, growing an oxide over said last boron-diffused area, removing a portion of said last grown oxide and diffusing phosphorus into a portion of said last boron-diffused region and to form an N-type region, evaporating and alloying aluminum to form contacts to said last mentioned boron-diffused area and to said phosphorus-diffused area.

References Cited by the Examiner

UNITED STATES PATENTS

| | | | |
|---|---|---|---|
| 2,981,877 | 4/1961 | Noyce | 148—187 X |
| 3,041,213 | 6/1962 | Anderson. | |
| 3,067,485 | 12/1962 | Ciccolella | 148—186 X |
| 3,089,793 | 5/1963 | Jordan | 148—187 |
| 3,200,019 | 8/1965 | Scott | 148—187 X |
| 3,226,612 | 12/1965 | Haenichen | 148—187 X |

HYLAND BIZOT, *Primary Examiner.*